(12) United States Patent
Moore et al.

(10) Patent No.: US 11,114,552 B2
(45) Date of Patent: Sep. 7, 2021

(54) INSULATED GATE TURN-OFF DEVICE WITH DESIGNATED BREAKDOWN AREAS BETWEEN GATE TRENCHES

(71) Applicant: Pakal Technologies, Inc., San Francisco, CA (US)

(72) Inventors: Paul M. Moore, Fremont, CA (US); Woytek Tworzydlo, Austin, TX (US); Richard A. Blanchard, Los Gatos, CA (US)

(73) Assignee: Pakal Technologies, Inc., San Francisco, CA (US)

( * ) Notice: Subject to any disclaimer, the term of this patent is extended or adjusted under 35 U.S.C. 154(b) by 0 days.

(21) Appl. No.: 16/823,096

(22) Filed: Mar. 18, 2020

(65) Prior Publication Data

US 2020/0312988 A1   Oct. 1, 2020

Related U.S. Application Data

(60) Provisional application No. 62/823,206, filed on Mar. 25, 2019.

(51) Int. Cl.
| | |
|---|---|
| *H01L 29/74* | (2006.01) |
| *H01L 29/745* | (2006.01) |
| *H01L 29/66* | (2006.01) |
| *H01L 21/265* | (2006.01) |
| *H01L 21/266* | (2006.01) |

(52) U.S. Cl.
CPC ........ *H01L 29/7424* (2013.01); *H01L 21/266* (2013.01); *H01L 21/26513* (2013.01); *H01L 29/66363* (2013.01); *H01L 29/7455* (2013.01)

(58) Field of Classification Search
CPC ................. H01L 29/745; H01L 29/749; H01L 29/66363; H01L 29/66325; H01L 29/1095; H01L 29/42308; H01L 29/7393; H01L 29/7436; H01L 29/4236; H01L 29/7394; H01L 2924/13055; H01L 29/7424; H01L 29/7455
See application file for complete search history.

(56) References Cited

U.S. PATENT DOCUMENTS

| | | | |
|---|---|---|---|
| 9,806,152 B2 * | 10/2017 | Akiyama | H01L 29/744 |
| 9,887,287 B1 * | 2/2018 | Lichtenwalner | H01L 29/1095 |
| 10,256,331 B2 * | 4/2019 | Akiyama | H01L 29/102 |
| 10,559,682 B2 * | 2/2020 | Naito | H01L 29/0834 |

* cited by examiner

*Primary Examiner* — Jose R Diaz
(74) *Attorney, Agent, or Firm* — Patent Law Group; Brian D. Ogonowsky

(57) ABSTRACT

An insulated gate turn-off (IGTO) device, formed as a die, has a layered structure including a p+ layer (e.g., a substrate), an n− drift layer, a p-well, trenched insulated gates formed in the p-well, and n+ regions between at least some of the gates, so that vertical npn and pnp transistors are formed. A cathode electrode is on top, and an anode electrode is on the bottom of the substrate. The device is formed of a matrix of cells. To turn the device on, a positive voltage is applied to the gates, referenced to the cathode electrode. To direct high energy electrons away from a gate oxide layer on the sidewalls of the trenches, boron is implanted between the trenches so p+ regions are formed in the mesas of the less-doped p-well. The p+ regions break down during an over-voltage event before the p-well breaks down in the mesas.

26 Claims, 10 Drawing Sheets

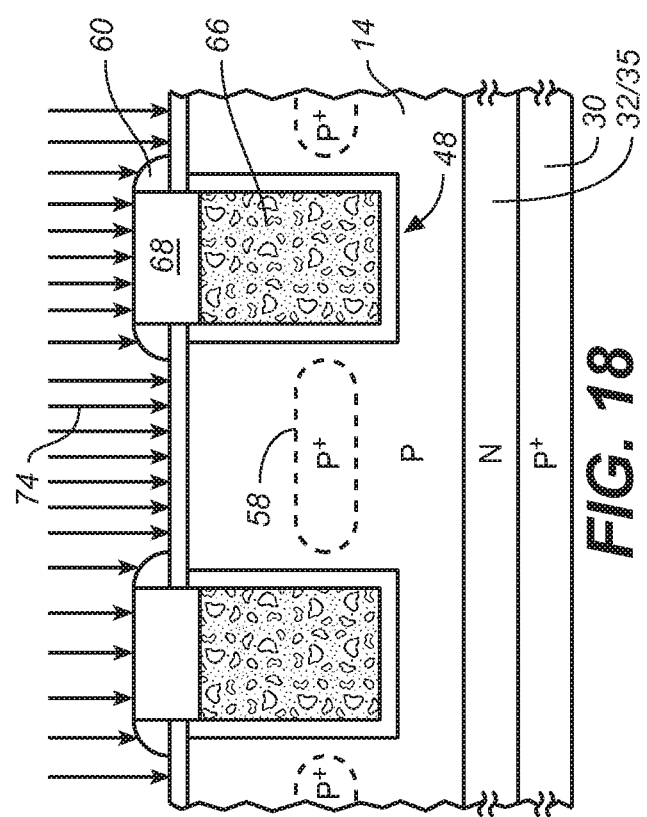

INSULATED GATE TURN-OFF DEVICE WITH DESIGNATED BREAKDOWN AREAS BETWEEN GATE TRENCHES

CROSS-REFERENCE TO RELATED APPLICATIONS

This application is based on provisional application Ser. No. 62/823,206, filed Mar. 25, 2019, by Paul M. Moore et al., assigned to the present assignee and incorporated herein by reference.

FIELD OF THE INVENTION

This invention relates to vertical, insulated gate turn-off (IGTO) devices having trenched gates and, more particularly, to preventing high energy electrons becoming trapped in the gate oxide during over-voltage conditions.

BACKGROUND

Applicant's U.S. Pat. No. 10,256,331, incorporated by reference, discloses a vertical IGTO device which will be used as an example of one of many types of vertical IGTO devices that can benefit from the present invention. An IGTO device from U.S. Pat. No. 10,256,311 will be described in detail, and the invention will later be described as a modification to such a device, and similar devices, rather than repeating a detailed description of the prior art portion of the inventive structure.

Prior art FIG. 1 is a cross-sectional view of a small portion of a vertical IGTO device 10 described in U.S. Pat. No. 10,256,331 that can benefit from the present invention. Although FIG. 1 just shows an edge portion of the cellular IGTO device 10, the invention applies to all areas within the cellular array.

A plurality of cells are shown having vertical gates 12 (e.g., doped polysilicon) formed in insulated trenches. A 2-dimensional array of the cells, forming a rectangular mesh, may be formed in a common, lightly-doped p-well 14, and the cells are connected in parallel.

N+ regions 18 surround the gates 12 and are contacted by a top, metal cathode electrode 20. The n+ regions 18 may be formed by implantation or by other known dopant introduction methods. At various areas 16, an n+ region 18 is opened to cause the cathode electrode 20 to "weakly" short the various n+ regions 18 to the p-well 14. FIG. 2 also shows this weak shorting. Such shorting weakly biases the p-well 14 to allow the n+ regions 18 to be at the cathode voltage while there is a voltage drop across the p-well 14 when current flows through the p-well 14. Such a voltage drop, if sufficiently high, forward biases the npn transistor's base-emitter junction to turn on the IGTO device 10.

The vertical gates 12 are insulated from the p-well 14 by an oxide layer 22. The gates 12 are connected together outside the plane of the drawing and are coupled to a gate voltage via a metal gate electrode 25 directly contacting the polysilicon portion 28. A patterned dielectric layer 26 insulates the gate electrode 25 from the p-well 14 and insulates the gates 12 from the cathode electrode 20. The guard rings 29 at the edge of the cell, and at the edge of the die, reduce field crowding for increasing the breakdown voltage.

A vertical npnp semiconductor layered structure is formed. There is a bipolar pnp transistor formed by a p+ substrate 30, an epitaxially grown n– drift layer 32, and the p-well 14. There is also a bipolar npn transistor formed by the n+ regions 18, the p-well 14, and the n– drift layer 32. An n-type buffer layer 35, with a dopant concentration higher than that of the n– drift layer 32, reduces the injection of holes into the n– drift layer 32 from the p+ substrate 30 when the device is conducting. A bottom anode electrode 36 contacts the substrate 30, and a top cathode electrode 20 contacts the n+ regions 18 and contacts the p-well 14 at selected locations. The p-well 14 surrounds the gate structure, and the n– drift layer 32 extends to the surface around the p-well 14.

When the anode electrode 36 is forward biased with respect to the cathode electrode 20, but without a sufficiently positive gate bias, there is no current flow, since there is a reverse biased vertical pn junction and the product of the betas (gains) of the pnp and npn transistors is less than one (i.e., there is no regeneration activity).

When the gate 12 is sufficiently biased with a positive voltage (relative to the n+ regions 18), such as 2-5 volts, an inversion layer is formed around the gate 12, and electrons from the n+ regions 18 become the majority carriers along the gate sidewalls and below the bottom of the trenches in the inversion layer, causing the effective width of the npn base (the portion of the p-well 14 between the n-layers) to be reduced. As a result, the beta of the npn transistor increases to cause the product of the betas to exceed one. This condition results in "breakover," when holes are injected into the lightly doped n– drift layer 32 and electrons are injected into the p-well 14 to fully turn on the device. Accordingly, the gate bias initiates the turn-on, and the full turn-on (due to regenerative action) occurs when there is current flow through the npn transistor as well as current flow through the pnp transistor.

When the gate bias is taken to zero, such as the gate electrode 25 being shorted to the cathode electrode 20, or taken negative, the IGTO device 10 turns off, since the effective base width of the npn transistor is increased.

The device 10 is intended to be used as a high voltage, high current switch with very low voltage drop. The maximum voltage for proper operation is specified in a data sheet for the device 10.

On occasion, there may be a voltage spike, such as due to an over-voltage transient on the supply voltage. Such a voltage spike may be well above the specified breakdown voltage of the IGTO device 10. The IGTO device 10 may then exhibit non-destructive breakdown in its "off" state, where high energy electrons are accelerated in the high electric field and knock off other electrons from atoms within the semiconductor structure. Avalanche breakdown may occur. If the spike is short, or where there is no extended periods of high heat, the breakdown is non-destructive, and normal operation occurs after the spike has ended.

However, such high energy electrons may become permanently trapped in the trenches' thin gate oxide 22, as shown in FIG. 2. FIG. 2 is a close-up of three cells in the IGTO device 10, or in other types of applicable vertical IGTO devices. Some of the high energy electrons 38, during avalanche breakdown, tunnel into the gate oxide 22 to become trapped electrons 40, since the high energy electrons 38 can move in angled and vertical paths. Such trapped electrons 40 result in a permanent negative charge in the gate oxide 22, which can effectively change the threshold voltage of the IGTO device 10. The trapped electrons 40 may also reduce the insulating capability of the gate oxide 22.

It would be desirable to avoid or mitigate the high energy electrons 38 becoming trapped in the gate oxide 22 during breakdown conditions.

SUMMARY

In one embodiment, the present invention entails modifications to the Applicant's previous IGTO devices to avoid or mitigate the high energy electrons becoming trapped in the trench's gate oxide during non-destructive breakdown conditions. The invention also applies to any other vertical trenched gate switch.

In one embodiment, assuming gate trenches are formed in a p-well, a localized p+ region is formed in the p-well mesas between the trenches. This p+ region undergoes avalanche breakdown before the more lightly doped p-well regions in the mesas. The p+ regions thus form a low-resistance path for the high energy electrons during the breakdown period. The high energy electrons thus take the path of least resistance through the center of the p+ regions, effectively channeling the high energy electrons away from the sidewall gate oxide. If the p+ regions are made fairly small and centered within each p-well mesa, the overall breakdown voltage of the IGTO device and its performance are not significantly reduced.

The p+ regions in the p-well mesas may be formed by an angled implantation of p-type boron ions through the sidewalls of the trenches. If the trenches are spaced fairly closely, the angled implants into opposing trench sidewalls will merge to form a single, centered p+ region between the opposing trench sidewalls.

In another method of fabrication, a spacer oxide layer may be formed on the silicon surface that overlaps edges of the trenches by a small amount. The spacer is then used as a mask for a non-angled high energy blanket deposition of boron ions into the surface, which implant at the desired depth near the center of the p-well mesas between the trenches. The implant energy and drive-in of the boron determines the final depth.

Other techniques are described.

BRIEF DESCRIPTION OF THE DRAWINGS

FIGS. 10-18 illustrate a process that forms centered p+ regions in the p-well mesas using an oxide spacer during a deep (high energy) blanket boron implant.

Elements that are the same or equivalent are labeled with the same numbers.

DETAILED DESCRIPTION

Figure 1:
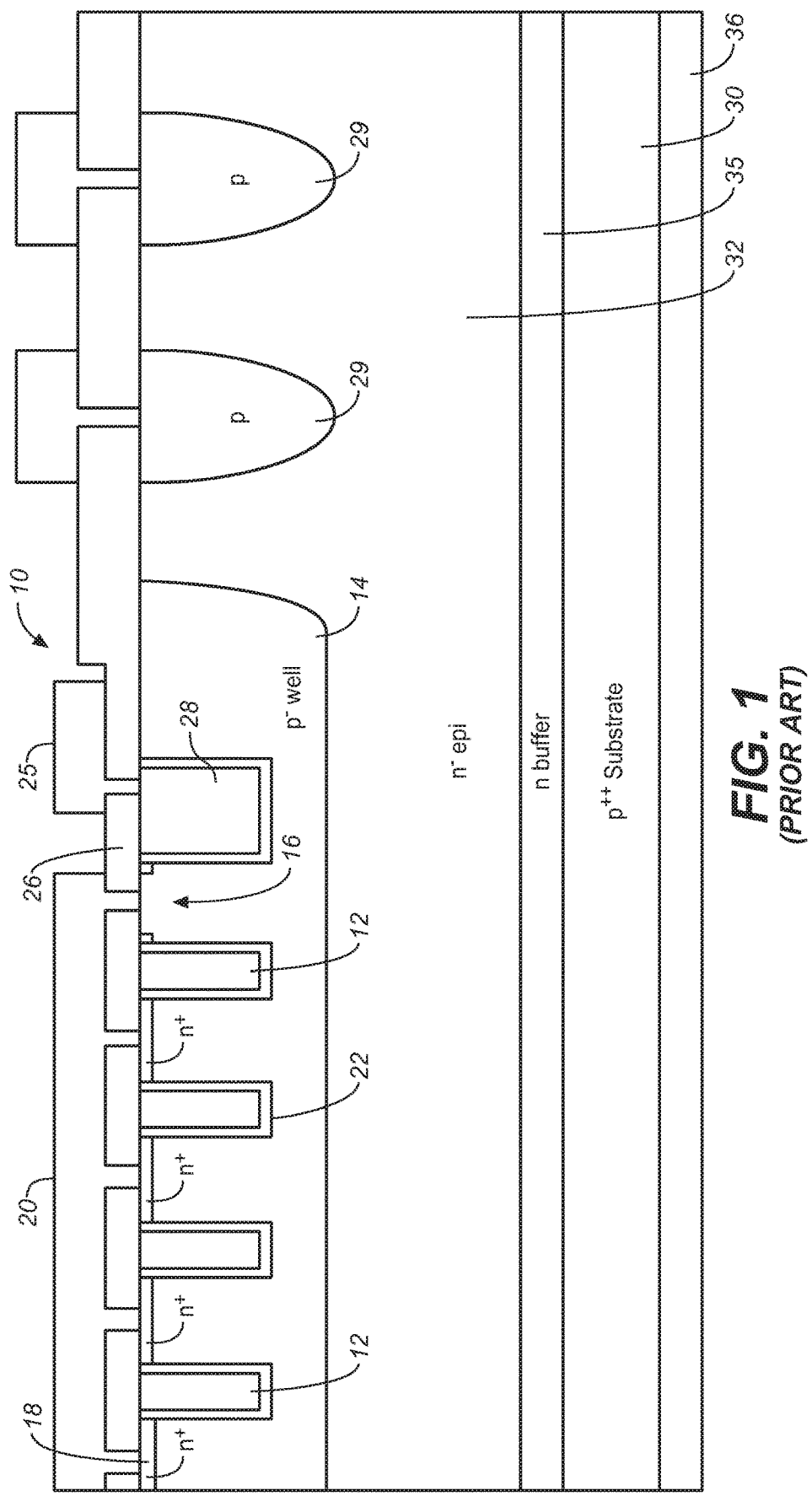
FIG. 1 is a cross-sectional view of a portion of a prior art IGTO device of the Applicant's own design.
Figure 2:
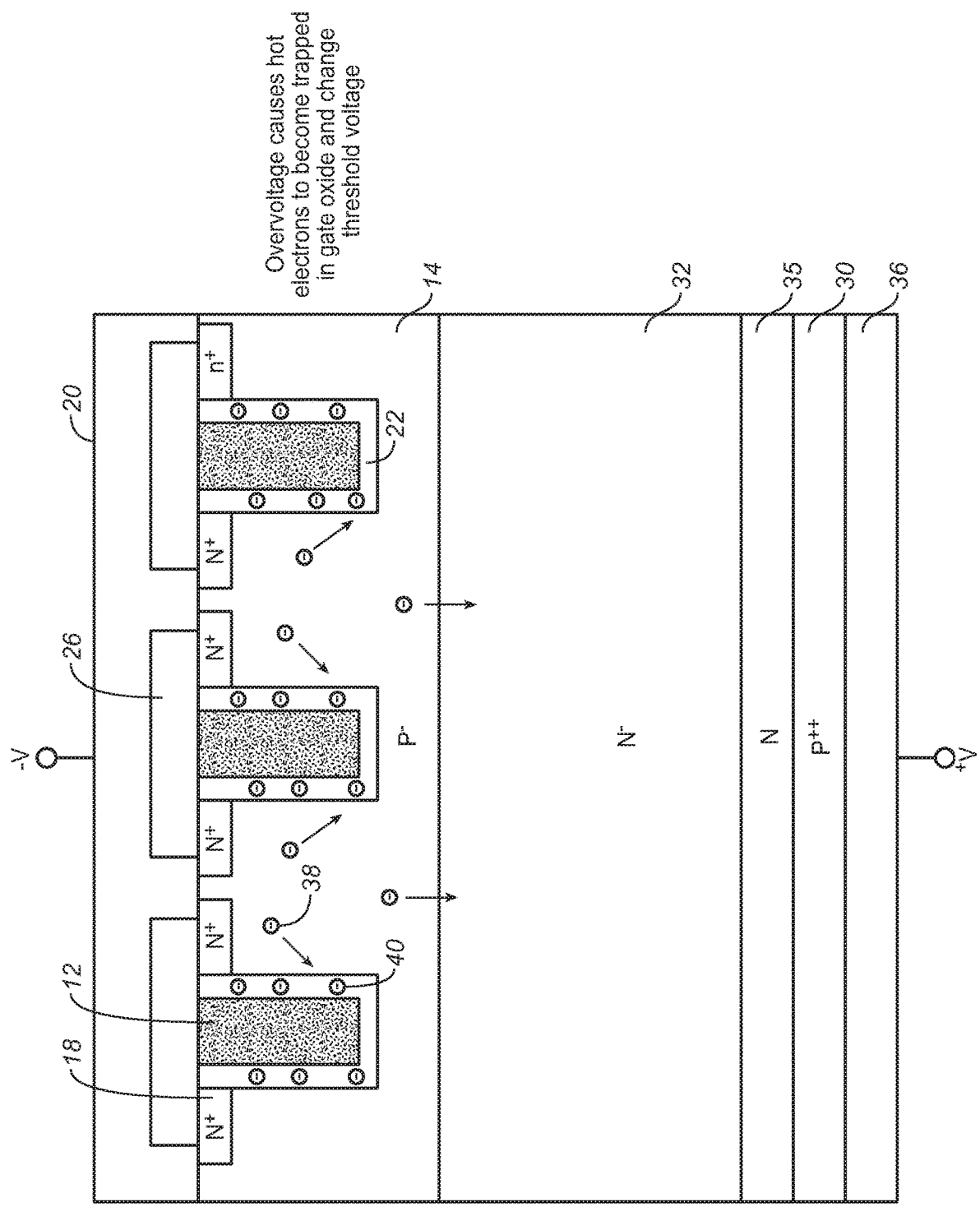
FIG. 2 is a close-up of a portion of the IGTO device of FIG. 1, or any other applicable IGTO device, showing how high energy electrons may become trapped in the trenches' gate oxide during a non-destructive breakdown occurrence.
Figure 3:
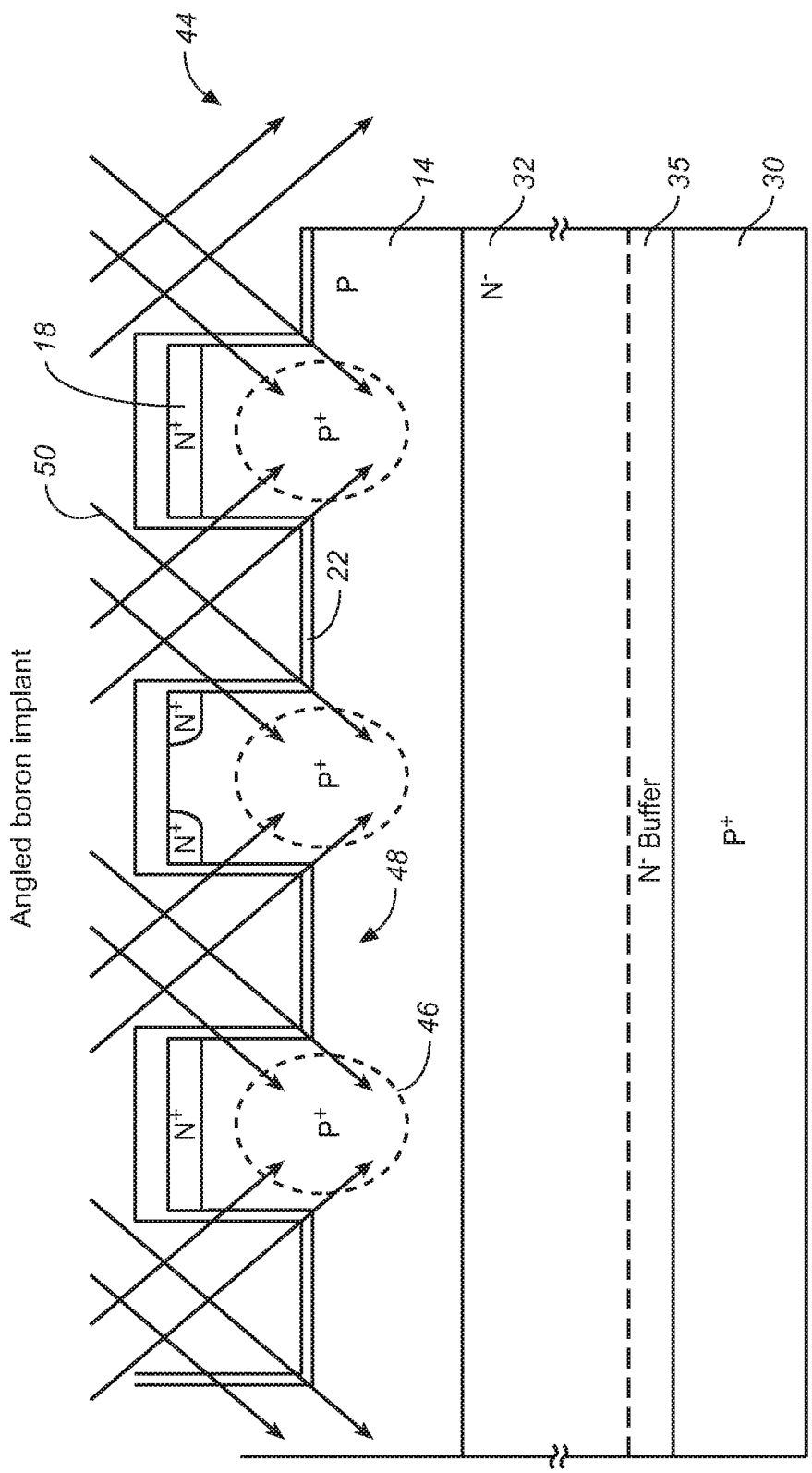
FIG. 3 illustrates how an angled boron implant through the trench sidewalls may be used to form p+ regions in the p-well mesa between trenches to form a low resistance path for high energy electrons during the breakdown period to channel the high energy electrons away from the gate oxide.

FIG. 3 illustrates a partially fabricated IGTO device 44, in accordance with one embodiment of the invention, where localized p+ regions 46 are formed in the p-well 14 mesas between gate trenches 48 prior to the trenches 48 being filled with the doped polysilicon gate material. The benefits of the p+ regions 46 in the p-well mesas also apply to any suitable vertical semiconductor trench switch, including IGBTs, thyristors, vertical MOSFETs, etc. For example, in other types of vertical switches, the trenched gates may extend completely through the p-well 14 and form an n-channel, when biased above the gate threshold voltage, directly between two vertical n-type layers. Thus, the focus of the invention is on the concept of adding p+ regions in p-well (or p-layer) mesas between gate trenches which break down before the breakdown of the p-well in that area so that the p+ regions channel high energy electrons away from the gate oxide along the trench sidewalls. This prevents the high energy electrons during a breakdown event from becoming permanently trapped in the gate oxide and affecting the performance of the device.

The various thicknesses of layers and regions, the depth of the trenches, and the dopant concentrations depend on the required characteristics of the IGTO device 44. If the n− drift layer 32 is grown over a p-type substrate, the n− drift layer 32 has a preferred thickness greater than 10 microns. Its doping concentration is preferably between about $5 \times 10^{13}$ to $5 \times 10^{14}$ $cm^{-3}$. This dopant concentration can be obtained by in-situ doping during epitaxial growth.

The p-well 14 is defined by a mask and formed by implanting dopants. The peak doping concentration in the p-well 14 can be, for example, $10^{16}$-$10^{18}$ $cm^{-3}$. The depth of the p-well 14 will typically be between 0.1-10 microns. The p-well 14 is wholly contained in the n-drift layer 32. Instead of an implanted p-well, a p-layer may be epitaxially grown over the n-drift layer 32.

An optional n-type buffer layer 35 may be implanted prior to the formation of the p-well 14 and has a dopant concentration between about $10^{17}$ to $5 \times 10^{17}$ $cm^{-3}$. The n-type buffer layer 35 reduces the injection of holes into the n− drift layer 32 from the p+ substrate 30 when the device is on, since the n-type buffer layer 35 has a dopant concentration higher than that of the n− drift layer 32.

The n+ regions 18 are formed over the p-well 14 surface by implantation. Note that the center n+ region 18 in selected cells has an opening for a metal cathode electrode to weakly short the n+ regions 18 to the p-well 14. The n+ type regions 18 have a depth of, for example, 0.05-1.0 microns. In one embodiment, the n+ type regions 18 are formed by an implant of arsenic or phosphorus at an energy of 10-150 keV and an area dose of $5 \times 10^{13}$ to $10^{16}$ $cm^{-2}$, to create a dopant concentration exceeding $10^{19}$ $cm^{-3}$.

Trenches 48 are then etched partially through the p-well 14 using masked reactive ion etching (RIE) or other conventional technique. In one embodiment, the trench depths can be 1-10 microns, and the minimum lateral trench widths are constrained by lithographic and etching limitations. A thin gate oxide layer 22 is then formed along the silicon sidewalls of the trenches 48 and the top surface of the structure to, for example, 0.05-0.15 microns thick.

Next, an angled implant of boron ions 50 is conducted so that the mesas act as a mask to prevent the boron being implanted deep into the p-well 14. The angled implant results in the boron distribution centers being between the trenches 48 and slightly deeper than the bottoms of the trenches 48. The proper implantation energy can be determined using simulation. A precise dopant concentration in the p+ regions 46 is not important since the higher dopant concentration will cause the p+ regions 46 to undergo avalanche breakdown before the p-well 14 in that vicinity breaks down and create a path for the high energy electrons away from the gate oxide 22. By widening a trench 48 or making the trenches 48 shallower, the positions of the p+ regions 46 can also be controlled.

The angled implant may be conducted while the wafer is angled with respect to the direction of the boron ions in a vacuum chamber.

The size of the p+ region 46 is not particularly important and will depend on the structure of the trenches. It is desirable that the p+ regions 46 not extend to the trenches 48 in order to allow the p-well 14 area adjacent to the trenches 48 to invert with a suitable gate bias voltage. However, it is acceptable if the boron implant slightly increases the net p-type dopant concentration along the trenches 48 if the p-well 14 along the trenches 48 can be inverted at a suitable gate bias voltage.

The angled implant, besides creating the p+ regions 46, also may partially counter-dope the n+ regions 18 near the gate oxide 22, which improves turn-off.

Figures 4, 5:
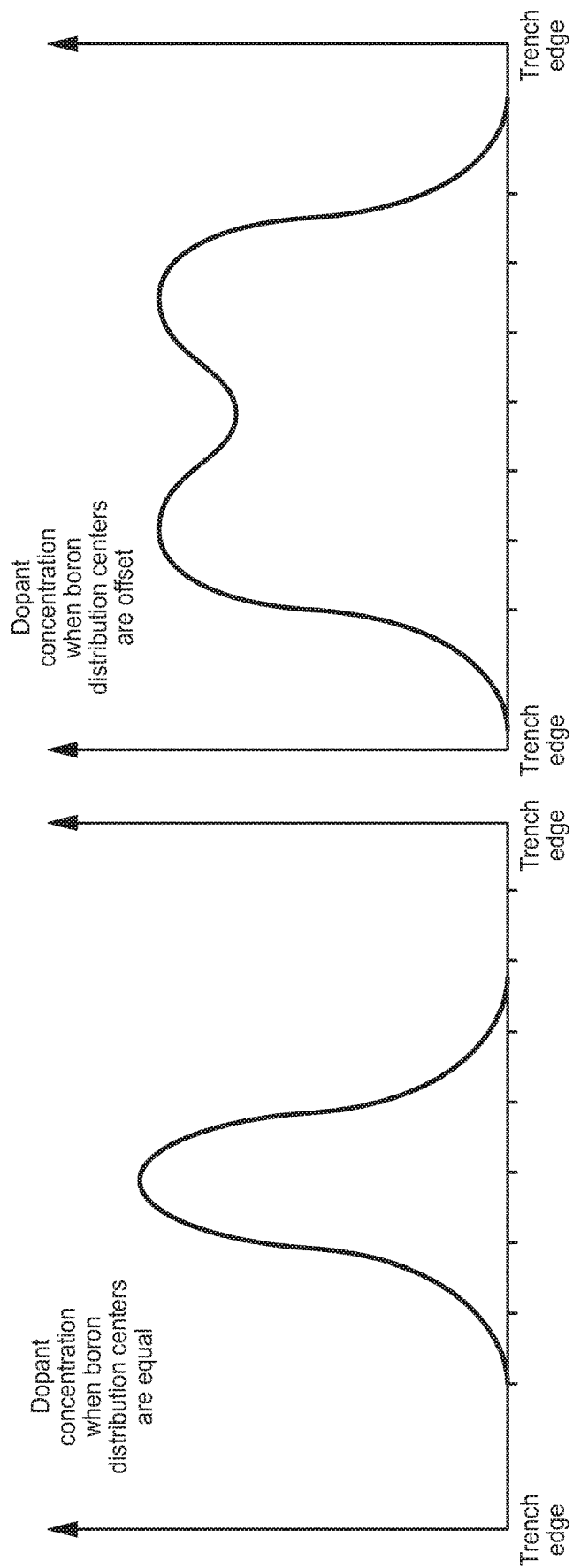
FIG. 4 illustrates the boron dopant concentration in the p-well between adjacent trenches when the boron distribution centers from implantation through opposing trench sidewalls overlap.
FIG. 5 illustrates the boron dopant concentration in the p-well between adjacent trenches when the boron distribution centers from angled implantation through opposing trench sidewalls do not overlap.

FIG. 4 illustrates the boron dopant concentration in the p-well 14 between adjacent trenches 48 when the boron distribution centers from angled implantation through opposing trench sidewalls overlap. This is considered ideal for directing the high energy electrons away from the gate oxide 22.

However, due to the particular trench structure, the boron distributions centers may be laterally separated (offset), but partially overlapping, as shown in FIG. 5. The p+ regions 46 will still adequately perform as described above.

Figure 6:
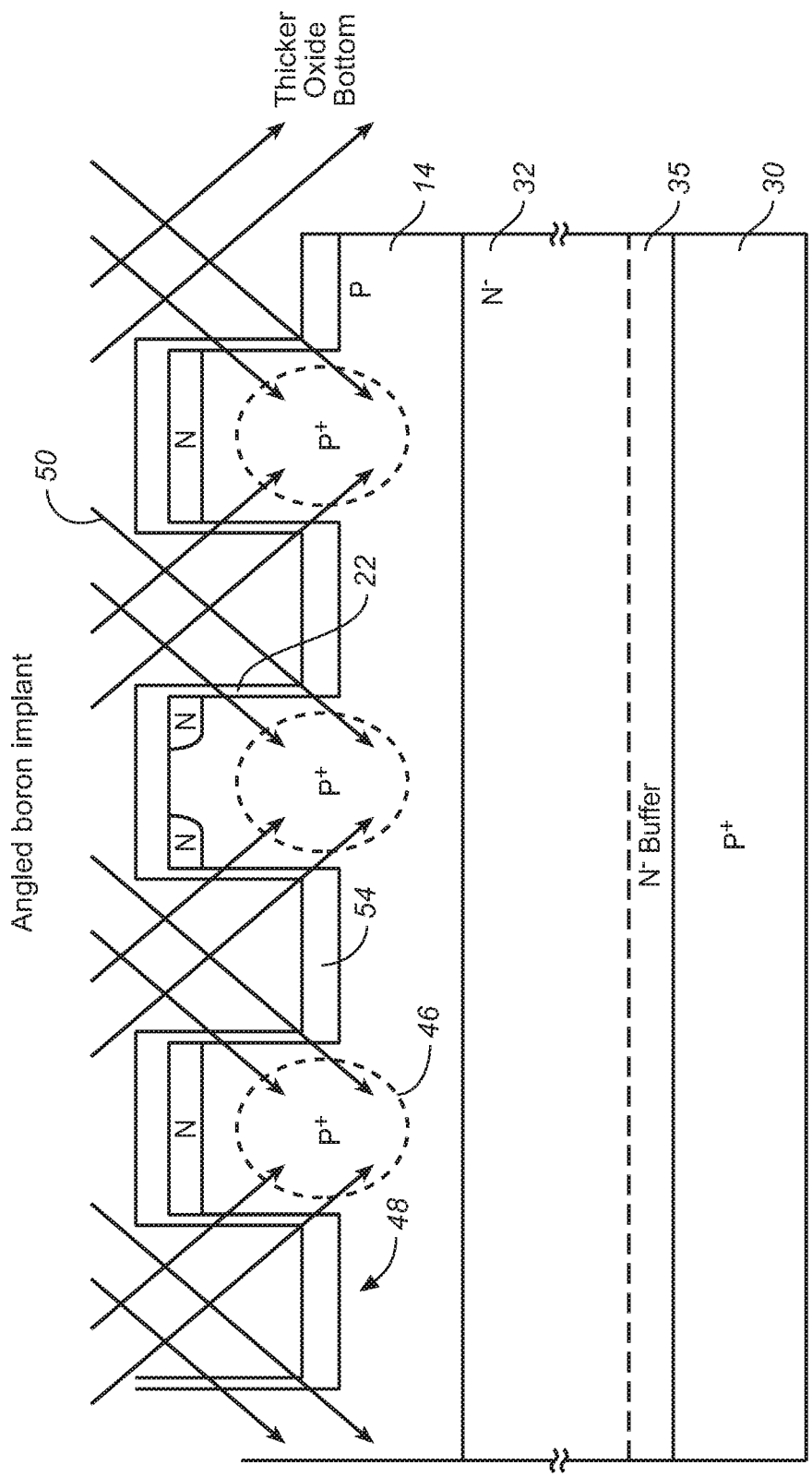
FIG. 6 illustrates how the gate oxide on the bottom of the trenches may be thicker than the gate oxide along the trench sidewalls to reduce the amount of implantation through the bottom surface of the trenches.
Figure 7:
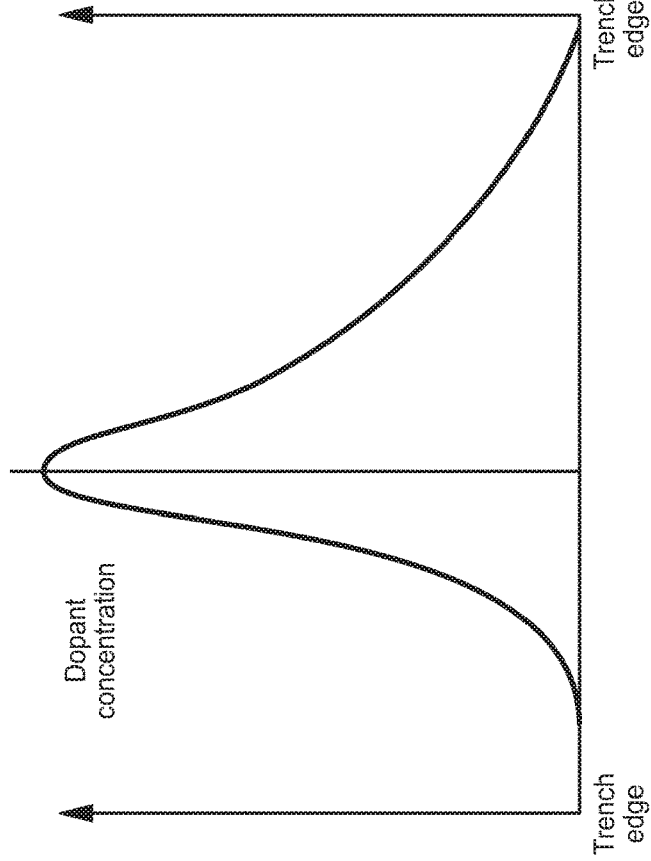
FIG. 7 illustrates a more defined boron dopant concentration in the p-well between adjacent trenches in FIG. 6 when the boron distribution centers from angled implantation through opposing trench sidewalls overlap.

FIG. 6 is similar to FIG. 3 except that the gate oxide 54 on the bottom of the trenches 48 is made thicker than the gate oxide 22 along the trench sidewalls to reduce the amount of implantation through the bottom surface of the trenches 48. This variation may improve the control of the shape and location of the p+ regions 46. For example, the p+ regions 46 may be made thinner and shallower using this technique FIG. 7 illustrates a more defined boron dopant concentration in the p-well 14 between adjacent trenches 48 in FIG. 6 when the boron distribution centers from angled implantation through opposing trench sidewalls overlap.

Figure 8:
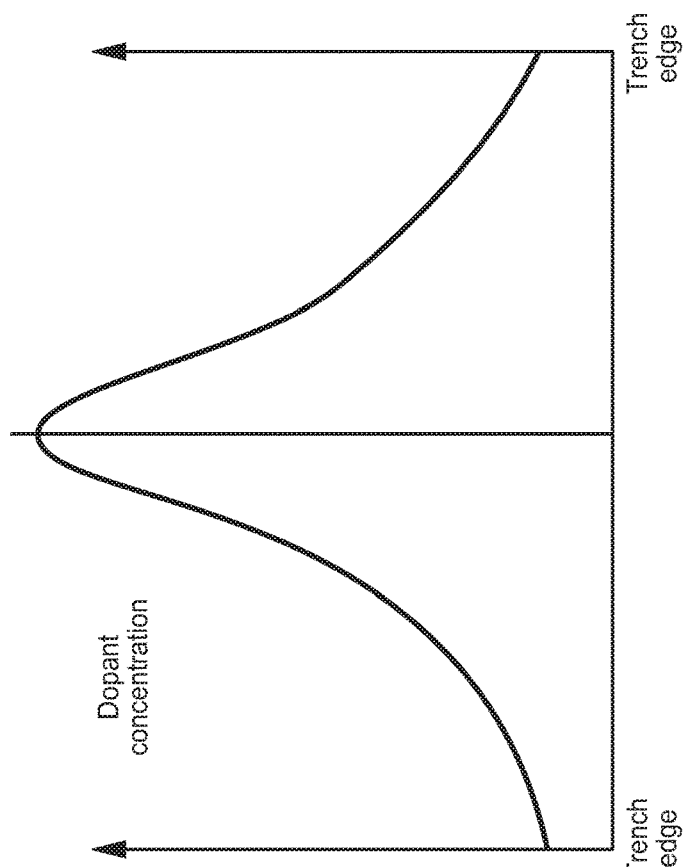
FIG. 8 illustrates the boron dopant concentration in the p-well between adjacent trenches in FIG. 6 when the boron distribution centers from angled implantation through opposing trench sidewalls overlap and the boron implant distribution extends completely across the p-well mesa.

FIG. 8 illustrates the boron dopant concentration in the p-well 14 between adjacent trenches 48 in FIG. 6 when the boron distribution centers from angled implantation through opposing trench sidewalls overlap and the boron implant distribution extends completely across the p-well mesa. Although the dopant concentration in the p-well 14 is slightly increase adjacent to the trench 48, the increase will not significantly increase the gate voltage needed to turn on the IGTO device.

Figure 9:
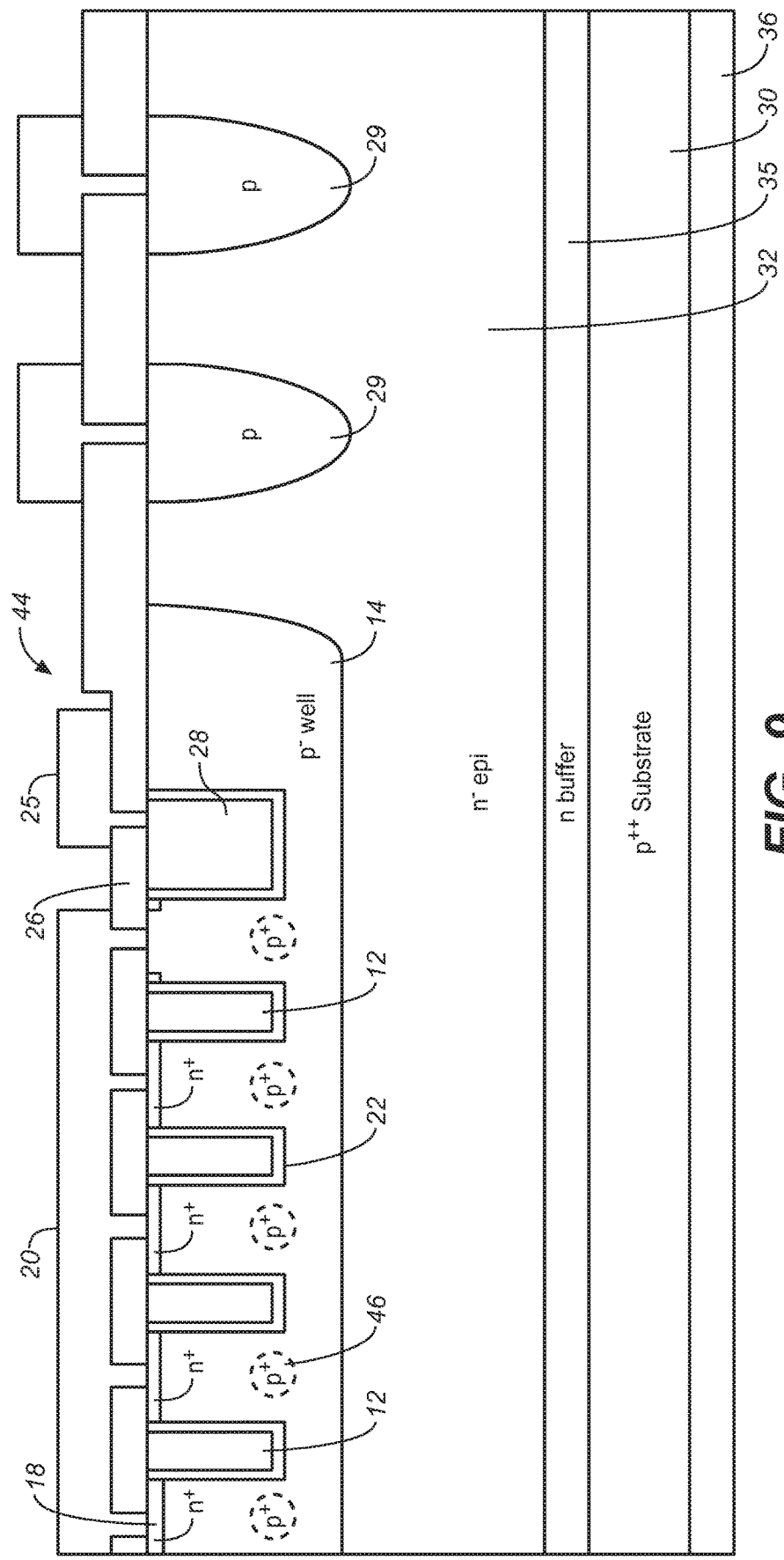
FIG. 9 illustrates the IGTO device of FIG. 1 augmented with the p+ regions in the p-well mesas.

As shown in FIG. 9, to complete the IGTO device 44, the trenches 48 are filled with a doped polysilicon to form the gates 12, the dielectric layer 26 is deposited and patterned, and various metallization steps are used to form the cathode electrode 20, gate electrode 25, and anode electrode 36.

In another embodiment, the starting substrate is n-type. The substrate is back-side doped with a deep implant to form the n-type buffer layer 35, followed by a shallower doping of boron to form the bottom p+ anode layer. The p-well 14 is then formed by implantation into the top surface of the substrate. This "thin anode" embodiment thus eliminates the need for epitaxially growing layers. The resulting structure can be represented by FIG. 9 where the p+ substrate 30 is the p-doped layer of the n-type substrate.

FIGS. 10-18 illustrate a process that forms centered p+ regions 58 in the p-well mesas using an oxide spacer 60 for a deep (high energy) blanket boron implant.

Figure 10:
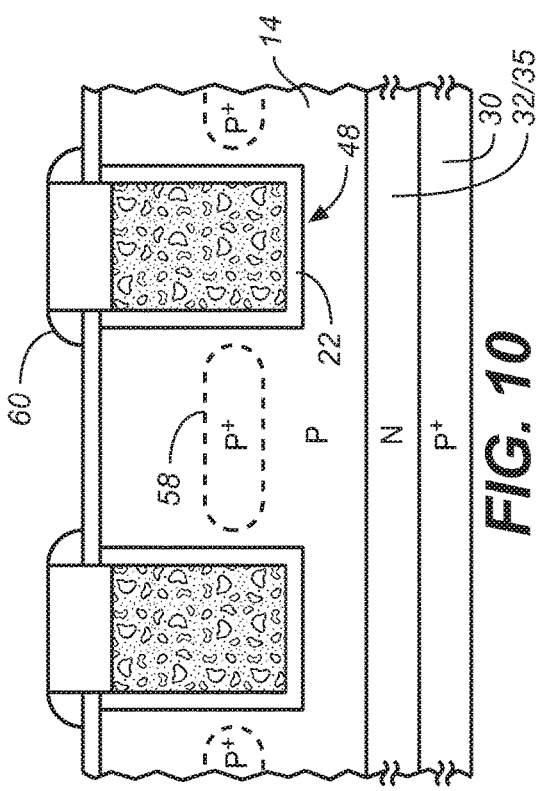

FIG. 10 is a cross-section after the boron implant, and FIGS. 11-18 illustrate how to obtain the structure of FIG. 10.

Figure 11:
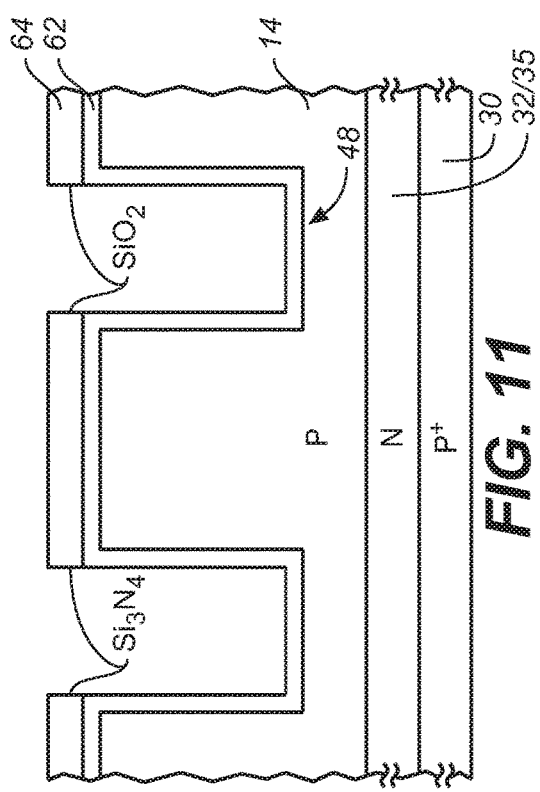

In FIG. 11, a silicon dioxide (SiO2) layer 62 is grown or deposited over the surface of the p-well 14. Next, a silicon nitride (Si3N4) layer 64 is deposited over the SiO2 layer 62. A photo-masking step is performed for patterning the Si3N4 layer 64 and the SiO2 layer 62. The trenches 48 are then etched.

Figure 12:
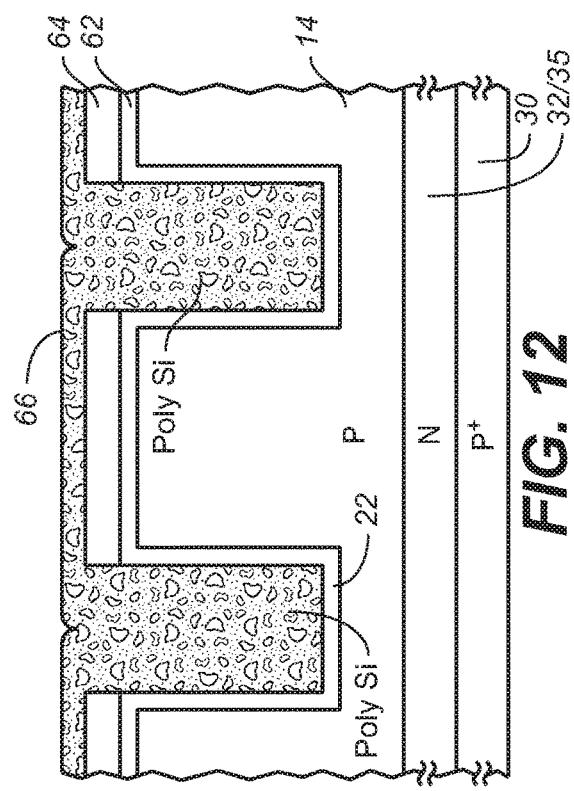

In FIG. 12, a thin gate oxide 22 is thermally grown on the surfaces of the trenches 48. Next, doped polysilicon 66 is deposited and fills the trenches 48.

Figure 13:
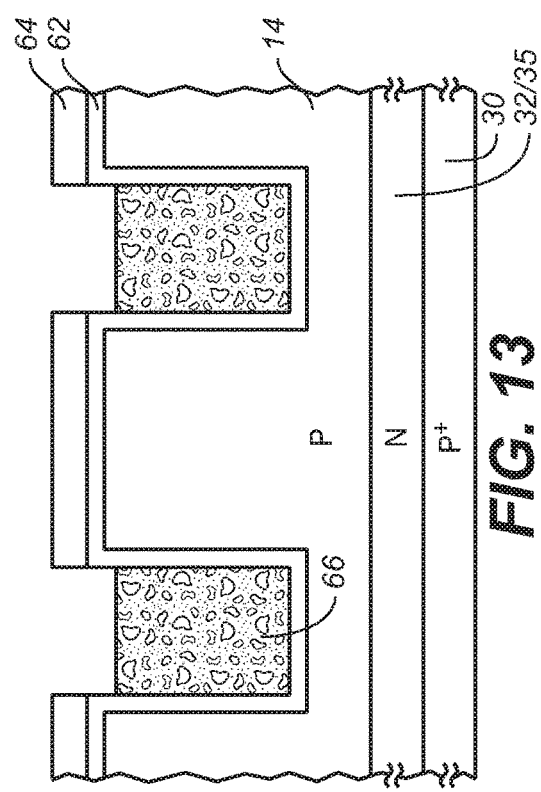

In FIG. 13, the polysilicon 66 is etched back to remove the polysilicon 66 from the surface of the p-well 14 so the polysilicon 66 is approximately even with the tops of the trenches 48.

Figure 14:
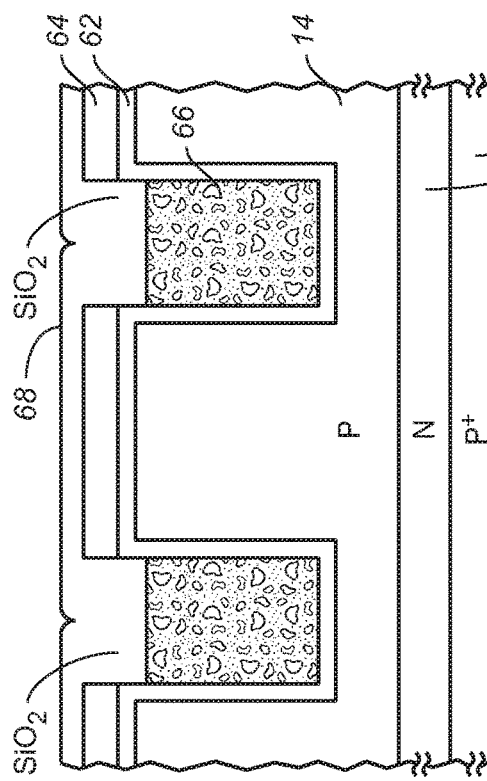

In FIG. 14, a SiO2 layer 68 is deposited over the surface.

Figure 15:
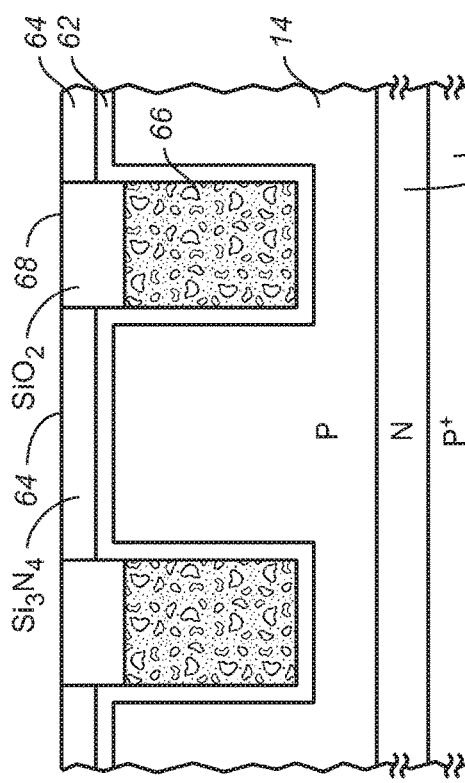

In FIG. 15, the SiO2 layer 68 is etched down to be even with the Si3N4 layer 64 so that the SiO2 layer 68 just covers the top of the polysilicon 66 in the trenches 48.

Figure 16:
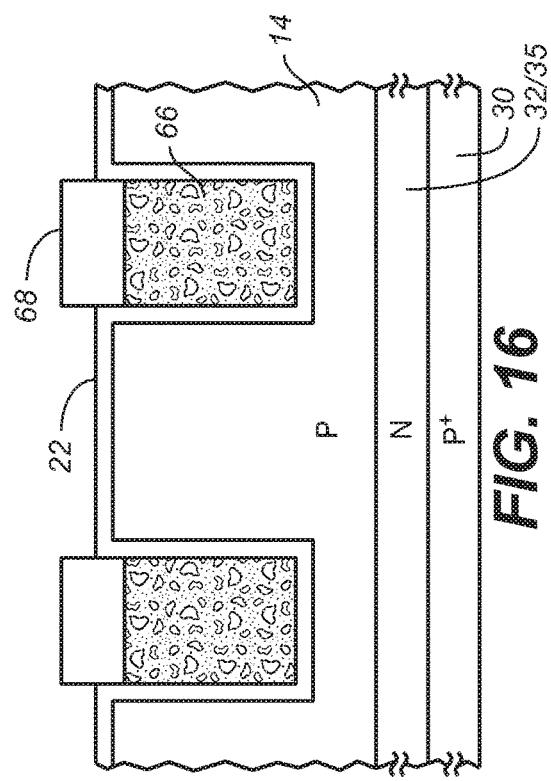

In FIG. 16, the Si3N4 layer 64 is removed.

Figure 17:
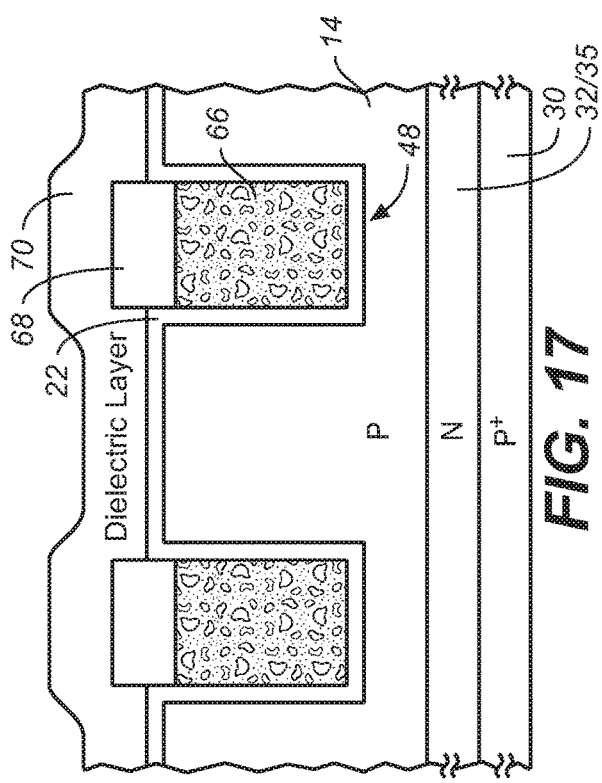

In FIG. 17, a dielectric layer 70 is deposited. The dielectric layer 70 may be an oxide, a nitride, or other suitable dielectric material that is used as an implant mask.

In FIG. 18, the dielectric layer 70 is etched without a mask to form spacers 60 that slightly extend over the edges of the trenches 48.

A high energy boron implant 74 is then performed to implant p-type (boron) dopants into the p-well 14 between adjacent trenches 48 to form the p+ regions 58. The depth does not have to be precise. The SiO2 layer 68 and the spacer 60 block the boron.

In the process of FIGS. 10-18, the p+ regions 58 may be formed to be wholly above a bottom of the trenches 48, as shown in FIG. 18. The p+ regions 58 may instead be formed to be partially above and partially below a bottom of the trenches 48, if simulations show improved performance.

As shown in FIG. 9, n+ regions 18 are then formed by a shallow implant. The n+ regions 18 may instead be formed prior to the step of FIG. 11 being performed.

A layer of dielectric may then be deposited, photo-masked, and etched to form contact regions.

Metallization is then performed to form the cathode electrode 20, the anode electrode 36, and the gate electrode 25. The resulting structure may be similar to FIG. 9.

A similar process may be performed for any trench-gated vertical switch. For example, if the trenches 48 extended below the p-well 14, and the substrate was an n+ type, a simple vertical MOSFET would be formed, and the resulting p+ regions 58 would be formed within the p-well 14 and have the same function of channeling high energy electrons away from the gate oxide during breakdown conditions. If the substrate remained a p+ type and the trenches 48 extended below the p-well 14, the device may be an IGBT, and the p+ regions 58 would perform the same function. The present invention may apply to all such MOS-gated power switches. In other words, the addition of the p+ regions between gate trenches directs the high energy electrons away from the gate oxide during an overvoltage breakdown event in a variety of MOS-gated power switches.

Various features disclosed may be combined to achieve a desired result.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A vertical insulated gate turn-off (IGTO) device comprising:
   a first semiconductor layer of a first conductivity type;
   a second semiconductor layer of a second conductivity type overlying the first semiconductor layer; and
   an array of cells comprising:
      a plurality of first insulated gates within trenches in the second semiconductor layer, the first insulated gates being electrically connected together, the first insulated gates having a gate oxide layer along sidewalls of the trenches; and
      first regions of the second conductivity type within the second semiconductor layer between at least some of the trenches, the first regions having a dopant concentration higher than a dopant concentration in the second semiconductor layer, wherein the first regions do not extend to the trenches,
      wherein a first portion of the second semiconductor layer is located above the first regions, and a second portion of the second semiconductor layer is located below the first regions,
      wherein the cells conduct a current when the first insulated gates are biased beyond a threshold voltage.

2. The device of claim 1 further comprising:
   second regions of the first conductivity type formed in the second semiconductor layer; and
   a third semiconductor layer of the second conductivity type underlying the first semiconductor layer, wherein the second regions, the second semiconductor layer, the first semiconductor layer, and the third semiconductor layer form vertical npn and pnp bipolar transistors.

3. The device of claim 2 wherein the device forms a vertical npnp structure.

4. The device of claim 3 wherein
   the third semiconductor layer is p-type, wherein the first semiconductor layer is n-type, wherein the second semiconductor layer is p-type, and wherein the second regions are n-type,
   wherein the third semiconductor layer, the first semiconductor layer, and the second semiconductor layer form a vertical pnp bipolar transistor, and
   wherein the second regions, the second semiconductor layer, and the first semiconductor layer form a vertical npn bipolar transistor.

5. The device of claim 4 wherein, when the first insulated gates are biased below the threshold voltage, a product of betas of the npn and pnp bipolar transistors is less than one, and wherein, when the first insulated gates are biased above the threshold voltage, a product of the betas of the npn and pnp bipolar transistors is greater than one to turn on the device.

6. The device of claim 4 further comprising an anode electrode contacting the third semiconductor layer, and a cathode electrode contacting the second regions.

7. The device of claim 1 wherein the second semiconductor layer comprises a well region.

8. The device of claim 1 wherein the gates terminate within the second semiconductor layer.

9. The device of claim 1 wherein a peak dopant concentration of the first regions is at approximately a midpoint between adjacent trench sidewalls.

10. The device of claim 1 wherein the first regions extend only above a bottom of the trenches.

11. The device of claim 1 wherein the first regions direct high energy electrons away from the gate oxide layer along the sidewalls of the trenches during an over-voltage breakdown event.

12. The device of claim 1 wherein the first regions are configured for breaking down during an over-voltage event to cause high energy carriers to be directed away from the gate oxide layer along the sidewalls of the trenches.

13. A vertical insulated gate turn-off (IGTO) device comprising:
   a first semiconductor layer of a first conductivity type;
   a second semiconductor layer of a second conductivity type overlying the first semiconductor layer; and
   an array of cells comprising:
      a plurality of first insulated gates within trenches in the second semiconductor layer, the first insulated gates being electrically connected together, the first insulated gates having a gate oxide layer along sidewalls of the trenches; and
      first regions of the second conductivity type within the second semiconductor layer between at least some of the trenches, the first regions having a dopant concentration higher than a dopant concentration in the second semiconductor layer,
      wherein a first portion of the second semiconductor layer is located above the first regions, and a second portion of the second semiconductor layer is located below the first regions,
      wherein the cells conduct a current when the first insulated gates are biased beyond a threshold voltage;
      wherein the first regions extend above and below a bottom of the trenches.

14. A method of forming a vertical insulated gate turn-off (IGTO) device comprising:
   providing a first semiconductor layer of a first conductivity type;
   forming a second semiconductor layer of a second conductivity type overlying the first semiconductor layer;
   etching trenches at least into the second semiconductor layer, the trenches having sidewalls;
   implanting dopants of the second conductivity type at an angle into the sidewalls of the trenches and into mesas of the second semiconductor layer between the trenches to form first regions of the second conductivity type within the second semiconductor layer between at least some of the trenches, the first regions having a dopant concentration higher than a dopant concentration in the second semiconductor layer, wherein the first regions do not extend to the trenches,
   forming a gate oxide layer on the sidewalls of the trenches; and
   depositing a conductive material into the trenches to form insulated gates, wherein the IGTO device conducts a current when the gates are biased beyond a threshold voltage.

15. The method of claim 14 wherein the step of forming the gate oxide layer occurs before the step of implanting dopants of the second conductivity type.

16. The method of claim 14 wherein the first regions are configured for breaking down during an over-voltage event to cause high energy carriers to be directed away from the gate oxide layer along the sidewalls of the trenches.

17. The method of claim 14 further comprising:
forming second regions of the first conductivity type in the second semiconductor layer; and
providing a third semiconductor layer of the second conductivity type underlying the first semiconductor layer, wherein the second regions, the second semiconductor layer, the first semiconductor layer, and the third semiconductor layer form vertical npn and pnp bipolar transistors.

18. The method of claim 17 wherein the device forms a vertical npnp structure, where
the third semiconductor layer is p-type, wherein the first semiconductor layer is n-type, wherein the second semiconductor layer is p-type, and wherein the second regions are n-type,
wherein the third semiconductor layer, the first semiconductor layer, and the second semiconductor layer form a vertical pnp bipolar transistor, and
wherein the second regions, second semiconductor layer, and first semiconductor layer form a vertical npn bipolar transistor.

19. The method of claim 18 wherein the third semiconductor layer comprises a substrate.

20. A method of forming a vertical insulated gate turn-off (IGTO) device comprising:
providing a first semiconductor layer of a first conductivity type;
forming a second semiconductor layer of a second conductivity type overlying the first semiconductor layer;
etching trenches at least into the second semiconductor layer, the trenches having sidewalls;
forming a gate oxide layer on the sidewalls of the trenches;
depositing a conductive material into the trenches to form insulated gates;
forming a dielectric material over the gates and over edges of the trenches for forming spacers; and
implanting dopants of the second conductivity type into mesas of the second semiconductor layer between the trenches, using the dielectric material as a mask, to form first regions of the second conductivity type within the second semiconductor layer between at least some of the trenches, the first regions having a dopant concentration higher than a dopant concentration in the second semiconductor layer, wherein a first portion of the second semiconductor layer is located above the first regions, and a second portion of the second semiconductor layer is located below the first regions, wherein the first regions do not extend to the trenches,
wherein the IGTO device conducts a current when the gates are biased beyond a threshold voltage.

21. The method of claim 20 wherein the first regions extend only above a bottom of the trenches.

22. The method of claim 20 further comprising:
forming second regions of the first conductivity type in the second semiconductor layer; and
providing a third semiconductor layer of the second conductivity type underlying the first semiconductor layer, wherein the second regions, the second semiconductor layer, the first semiconductor layer, and the third semiconductor layer form vertical npn and pnp bipolar transistors.

23. The method of claim 22 wherein the device forms a vertical npnp structure, where
the third semiconductor layer is p-type, wherein the first semiconductor layer is n-type, wherein the second semiconductor layer is p-type, and wherein the second regions are n-type,
wherein the third semiconductor layer, the first semiconductor layer, and the second semiconductor layer form a vertical pnp bipolar transistor, and
wherein the second regions, second semiconductor layer, and first semiconductor layer form a vertical npn bipolar transistor.

24. The method of claim 23 wherein the third semiconductor layer comprises a substrate.

25. The method of claim 20 wherein the first regions are configured for breaking down during an over-voltage event to cause high energy carriers to be directed away from the gate oxide layer along the sidewalls of the trenches.

26. A method of forming a vertical insulated gate turn-off (IGTO) device comprising:
providing a first semiconductor layer of a first conductivity type;
forming a second semiconductor layer of a second conductivity type overlying the first semiconductor layer;
etching trenches at least into the second semiconductor layer, the trenches having sidewalls;
forming a gate oxide layer on the sidewalls of the trenches;
depositing a conductive material into the trenches to form insulated gates;
forming a dielectric material over the gates and over edges of the trenches for forming spacers; and
implanting dopants of the second conductivity type into mesas of the second semiconductor layer between the trenches, using the dielectric material as a mask, to form first regions of the second conductivity type within the second semiconductor layer between at least some of the trenches, the first regions having a dopant concentration higher than a dopant concentration in the second semiconductor layer, wherein a first portion of the second semiconductor layer is located above the first regions, and a second portion of the second semiconductor layer is located below the first regions,
wherein the IGTO device conducts a current when the gates are biased beyond a threshold voltage;
wherein the first regions extend above and below a bottom of the trenches.

* * * * *